United States Patent [19]

Martin et al.

[11] Patent Number: 5,472,914

[45] Date of Patent: Dec. 5, 1995

[54] WAFER JOINED OPTOELECTRONIC INTEGRATED CIRCUITS AND METHOD

[75] Inventors: Eric A. Martin, Medford; Kenneth Vaccaro, Acton; Joseph P. Lorenzo, Stow; Andrew Davis, Boston, all of Mass.

[73] Assignee: The United States of America as represented by the Secretary of the Air Force, Washington, D.C.

[21] Appl. No.: 274,882

[22] Filed: Jul. 14, 1994

[51] Int. Cl.$^6$ ................................................. H01L 21/60
[52] U.S. Cl. ................................ 437/209; 437/2; 437/3; 437/974; 148/DIG. 135
[58] Field of Search ................................ 437/2, 3, 6, 209, 437/974; 148/DIG. 135; 257/449, 460, 461, 462, 466

[56] References Cited

U.S. PATENT DOCUMENTS

| | | | |
|---|---|---|---|
| 4,618,877 | 10/1985 | Araki et al. | 437/6 |
| 4,695,861 | 9/1987 | Paine et al. | 257/460 |
| 4,794,439 | 12/1988 | Webb et al. | 257/461 |
| 4,996,573 | 2/1991 | Hack et al. | 257/449 |
| 4,999,694 | 3/1991 | Austin et al. | 257/449 |
| 5,008,213 | 4/1991 | Kolesar, Jr. | 437/51 |
| 5,171,712 | 12/1992 | Wang et al. | 437/924 |
| 5,180,681 | 1/1993 | Mishra et al. | 437/40 |
| 5,204,278 | 4/1993 | Imamura et al. | 437/40 |
| 5,264,699 | 11/1993 | Barton et al. | 257/460 |
| 5,304,500 | 4/1994 | Timlim et al. | 257/460 |

OTHER PUBLICATIONS

USAF Invention Disclosure: Packaging Process For Long Wavelength Backside Illuminated Photo–Transistor Receiver, pp. 2–3 no date.

E. A. Martin, K. Vaccaro, W. Waters, S. Spaziani, And J. P. Lorenzo, Processing and Design Techniques for InGaAs/InAlAs/InP Photo FETs and MSMs, Mar. 1994, pp. 347–350.

"Light–Induced Effects in GaAs F.E.T.S." by J. Graffeuil et al, Electronics Letters vol. 15 No. 14, 5 Jul. 1979.

"Potential of CCDs for UV and X–ray plasma diagnostics" by J. R. Jamesick et al. Review of Scientific Instruments 56(5), May 1985.

"Picosecond HEMT Photodetector" by T. Umeda et al. Japanese Journal of Applied Science, vol. 25 No. 10, Oct. 1986.

Effect of Signal–Modulated Optical Radiation on the Characteristics of a Modfet by H. Mitra et al Applied Physics A56, 335–341 (1993).

Solid–state reaction mediated low–temperature bonding of GaAs and InP wafers to Si substrates, by Z. Ma, G. Zhou, H. Morkoc, and L. Allen, Appl. Phys Lett., vol. 64, No. 6, pp. 772–774, 1994.

*Primary Examiner*—Kevin M. Picardai
*Attorney, Agent, or Firm*—Gerald B. Hollins; Thomas L. Kundert

[57] ABSTRACT

A full wafer to full wafer integrated circuit fabrication process wherein substrate removal and replacement of one wafer is used to enable an accurate alignment of this wafer with features of a receiving wafer during a see through alignment step. The invention is disclosed in terms of a wafer of photo field effect transistors being combined with a wafer of circuit devices that attend the photo field effect transistor devices. Use of the invention with the different material combination option desired for a photodetector device and its attending circuitry is also disclosed. Advantages over the more conventional chip by chip combination of wafer devices are also disclosed.

16 Claims, 2 Drawing Sheets

WAFER JOINED OPTOELECTRONIC INTEGRATED CIRCUITS AND METHOD

RIGHTS OF THE GOVERNMENT

The invention described herein may be manufactured and used by or for the Government of the United States for all governmental purposes without the payment of any royalty.

CROSS REFERENCE TO RELATED APPLICATIONS

The present document is somewhat related to the copending and commonly assigned patent applications "BACKSIDE ILLUMINATED FET OPTICAL RECEIVER AND METHOD WITH GALLIUM ARSENIDE SPECIES", Ser. No. 08/214,931; FET OPTICAL RECEIVER USING BACKSIDE ILLUMINATION, INDIUM PHOSPHIDE SPECIES", Ser. No. 08/274,930; and "BACKSIDE ILLUMINATED MSM DEVICE", Ser. No. 08/274,889 which are filed of even date herewith in the names of different inventor entities. The contents of these related applications are hereby incorporated by reference herein.

BACKGROUND OF THE INVENTION

This invention relates to the field of joined-together but possibly dissimilar substrate-received integrated circuit devices, for example to devices having one component of the optical type and additional components of the elecrical type.

Assembly of electronic circuit components from the dissimilar semiconductor materials that are often required for e.g. a combined optical and electronic systems, i.e. for optoelectronic systems onto a common circuit substrate has traditionally been achieved through hybrid integration procedures wherein component elements from different semiconductor materials are collected individually side by side onto a common (third) dielectric substrate. This process which involves handling individual subelements (i.e. circuit die) is expensive and time consuming and precludes benefits such as the optimum reduction of parasitic distances between components. The alignment distances and metallization thickness used in such an assembly are in fact quite crude as compared to those realizable with photolithographic techniques, which can realize submicron features. Hence circuit performance in such hybrid devices are fundamentally limited.

Recently attempts have been made to monolithically integrate these circuits through the growth of dissimilar materials onto a common substrate, such as by growing Indium Phosphide or Gallium Arsenide semiconductor layers onto a Silicon substrate. These attempts have been hampered however by fundamental crystallographic differences in the materials, differences which severely limit achieved device quality. Although this type of monolithic integration promises to become a technique of choice once growth capabilities are advanced, a presently achievable technique is here disclosed for achievement of this optoelectronic and other circuit integrations.

The patent of E. S. Kolesar Jr., U.S. Pat. No. 5,008,213, discloses the use of epoxy materials in the fabrication of multiple die sourced electronic circuit devices. Both this patent and the reference patents cited for the examination of this patent are believed to be of background interest with respect to the present invention.

This reference does not, however, disclose the full wafer marriage of possible dissimilar material-based electronic circuit die and the use of, substrate-removed, see through alignment techniques to achieve this marriage as is accomplished in the present invention.

SUMMARY OF THE INVENTION

In the present invention a full wafer array of electronic circuit devices such as photodetector transistors are married with a full wafer array of attending circuitry devices using a substrate removal and see-through alignment procedure. The resulting aligned and bonded-together wafers may be of different semiconductor material so the advantages of photodetectors fabricated from an optimum material and attending circuitry (such as amplifiers, switches and bias sources) fabricated from a different optimum material are possible.

It is an object of the present invention therefore to provide a two wafer electronic circuit assembly fabrication procedure.

It is another object of the invention to provide a removed substrate two wafer visual alignment procedure for the full wafer fabrication of circuit assemblies.

It is another object of the invention to enable the use of optimum fabrication materials in both a phototransducer device and in the amplifiers and other circuits attending such devices.

It is another object of the invention to provide a two wafer assembly procedure that can be used with many types of electronic circuit devices.

It is another object of the invention to provide an adhesive based two wafer circuit assembly procedure.

It is another object of the invention to provide for the combination of arsenic inclusive semiconductor materials such as gallium arsenide with silicon or indium phosphide or other semiconductor materials in a single circuit assembly.

It is another object of the invention to provide a multiple substrate electrical circuit fabrication process in which each of the joined together circuits is previously frozen in geometric precision to enable large area accurate joining.

It is another object of the invention to realize the advantages available from the combining of a substrate removal procedure with the (thusly enabled) accurate visual alignment of joined substrates.

It is another object of the invention to overcome the tedious, costly, and quality degrading aspects of combining different substrate mounted integrated circuit devices using a single die at a time procedure.

It is another object of the invention to provide a two-substrate removal process for joining multiple wafer-received integrated circuit die.

Additional objects and features of the invention will be understood from the following description and claims and the accompanying drawings.

These and other objects of the invention are achieved by the full wafer method of fabricating first semiconductor material comprised and second semiconductor material comprised photo transducer inclusive electronic circuit assemblies comprising the steps of:

forming on an exposed surface of a first semiconductor material first wafer substrate member a buffer and stop etch layer of a first metal inclusive alloy;

growing on said buffer and stop etch layer an optical energy absorbing layer of second semiconductor material composition;

depositing on said second semiconductor material layer a current blocking barrier layer of a second metal inclusive alloy;

removing lateral area portions of said formed, grown and deposited layers to define in the remainder thereof upstanding epitaxial layered mesas of said second semiconductor material included composition;

disposing layers of ohmic electrical contact first metal alloy on selected contact areas of said upstanding epitaxial layered mesas;

fabricating electrical gate non-conductive electrodes of second metal alloy composition on selected areas of said upstanding epitaxial layered mesas;

attaching exposed mesa surface portions of said wafer of photodetector devices to a surface coated optically transparent intermediary second substrate member;

removing said first semiconductor material first wafer from said second intermediary substrate member attached mesas to expose said optical energy layer backside surface portion of each said mesa;

visually aligning said second intermediary substrate member fixed wafer array of mesas and said disposed and fabricated areas of first and second metal alloy attendant thereto with registered and additional metal attended electrical circuit areas of a third substrate member second semiconductor wafer;

contacting and bonding together said second substrate member metal alloy and said third substrate member additional metal to form an array of two-wafer received electrical circuit assemblies having an exposed backside photodetector input port each;

removing said intermediary second substrate member from said bonded together electrical circuit assemblies; and segregating said array of two substrate wafer received electrical circuit assemblies into individual circuit die of said second semiconductor and said second substrate member respective dispositions and exposed backside photodetector input port each.

DETAILED DESCRIPTION

Figure 1A:
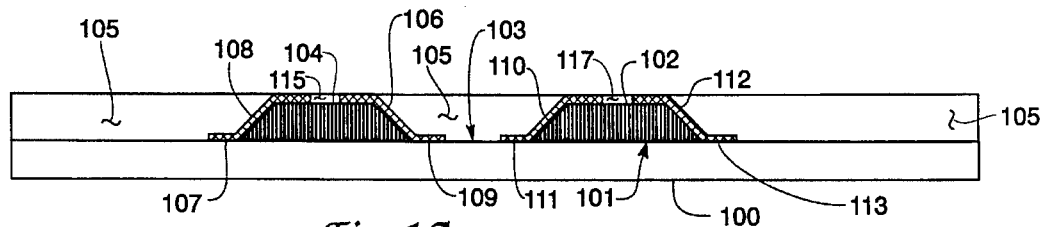
FIG. 1A shows a first sacrificial substrate received pair of photodetector devices according to the invention.

High data rate optical communications systems such as those proposed for the emerging United States national information infrastructure require high speed optoelectronic components for conversion of electrical signals into optical pulses, and for the reciprocal process of detecting received optical signals. To keep bandwidth of these systems high, parasitic circuit elements within the transmit and receive components of the system must be minimized. This is best achieved through integration of all components of a receiving or transmitting apparatus onto a common substrate, thus reducing electrical interconnect distances between elements. Electronics technology has advanced from discrete transistors to highly functional integrated circuits through the concept of monolithic integration. In this monolithic integration large numbers of components (in this case transistors) are fabricated simultaneously on a common substrate—usually a silicon wafer. This single silicon substrate leads to the term "monolithic" which according to Webster's dictionary arises from the concept of a single crystal or a "single stone".

Optically active multi-gigahertz electronic and photonic components need however to be fabricated from materials other than silicon. Here is a process is described for fabricating devices on their respective optimum substrates, then combining them while still at the wafer level. We define this process as polylithothetic integration ("polylithic" for "multi-stone" in contrast to monolithic; "lithothetic" for "stone setting" in contrast to lithographic or "stone writing").

Through this lithothetic process components from dissimilar materials are thinned and supported so that they can be assembled into a functioning circuit using standard photolithographic equipment which provides "see through" alignment registration that is thousands of times more accurate than is achievable through hybrid techniques. After the devices are thinned a sacrificial supporting substrate holds the geometrical patterning of the devices in frozen geometric precision as they were fabricated on the original wafer. This sacrificial substrate is also provided with optical transmission properties and thereby acts much like a common mask used for photolithographic realization of microelectronics. Rather than being a shadow mask that only transfers the physical layout of the desired structures, this substrate contains actual functioning devices however.

All microelectronics and electro-optic devices also consist of metallurgical junctions and interfaces defined through some patterning process. Lithography is the most common patterning technique, yet is by itself insufficient to produce functionality and further process steps are required. In the invention described here, that of polylithothetic integration, circuit functionality is transferred onto a permanent semiconducting substrate which includes receptor metallurgical junctions. Hence not only a pattern, but a circuit die interface is transferred with complete functionality resulting. The presently described method therefore is believed to represent an evolution increment in microelectronics and micro-optoelectronic technology.

Although the description following is based on the marriage or integration of an optical transducer device from one wafer with attending electrical circuitry and a physical support structure from a second wafer, it should be apparent that the described arrangements may be used with non optical electronic devices so long as the see-through alignment step can be achieved. Substrate removal is of course an enabling part of this marriage sequence.

The active semiconducting layers of the herein described optical detector may be grown epitaxially on three inch or other size InP wafers, i.e. on a first sacrificial substrate 100, by Molecular Beam Epitaxy (MBE) or MOCVD techniques. In contact with the InP substrate 100 in FIG. 1 is grown an Indium Aluminum Arsenide (InAlAs) buffer layer/etch stop which is indicated at 101 in FIG. 1, but which is so thin (i.e. 0.1 micrometers) as to not be shown in the FIG. 1 drawing.

An indium phosphide (InP) substrate 100 is used in the FIG. 1 fabrication sequence in order to desirably determine the crystal structure of the arsenic inclusive materials added to this substrate in fabricating the optoelectronic transducer devices 102 and 104 in subsequent steps. Additional details concerning use of one semiconductor material to determine the crystal structure of a different epitaxially formed layer and thereby select the spectral response region of a fabricated phototransistor etc. are disclosed in the copending applications referred to above and incorporated by reference herein.

After growth of the buffer layer 101, the InGaAs absorbing region for the optical detectors, the optically absorbing channel layer for photo-FETs 102 and 104, is grown. This can be achieved with a procedure that is similar to that used in the copending Martin et al Ser. No. 08/274,930 patent document. The thickness of this optical energy absorbing layer affects the efficiency of the detector as is known in the art. Lastly is grown an InAlAs layer which forms a current blocking barrier. After material growth, the devices are patterned lithographically and chemically etched to produce the FIG. 1 illustrated mesas of layered epitaxial material.

Ohmic (conducting) electrical contacts 106, 108, 110, and 112 are formed on these mesas by evaporating layers of gold-germanium-nickel (AuGeNi) alloy onto the mesa surfaces. Electrical gate (non-conducting) electrodes, not shown in FIG. 1, are then produced by evaporated titanium-gold (Ti/Au). These metal ohmic and gate contacts reach from the active device top surface of the mesa down the sloping sides to the exposed InP surface 103. The contact surface regions on the InP will later be exposed by substrate removal and form the basis for electrical contacting of the FIG. 1A device with the second substrate devices as described below. This completes fabrication of the detectors 102 and 104. In the instance when the optoelectronic device being fabricated in FIG. 1 is a photo MESFET, the thus-for accomplished portions of the FIG. 1 processing sequence may resemble the similar early portions of the fabrication sequence in the Ser. No. 08/214,930 document.

After completion of the device 102 and 104 fabrication sequence, the upward facing surfaces of these devices, including the metal conductors 106, 108, 110 and 112 is covered with a pliant uncured adhesive material such as an epoxy adhesive. This adhesive layer is indicated at 105 in FIG. 1A; the material of this layer also fills the regions 115 and 117 between ends of the electrodes 106, 108 and 110, 112. The adhesive used at 105 is preferably of the H74 type thermal conducting electrically insulating type sold by Epoxy Technology Inc. of Billerica, Mass. This adhesive or its equivalent is sufficiently transparent in both its uncured and cured states to enable the see-through alignment of the FIG. 1C step as is described below.

For backside processing of the FIG. 1A devices 102 and 104, the front of the FIG. 1A subassembly is fixed to an intermediary or second sacrificial substrate plate 116 by the adhesive of the layer 105. This fixing is achieved by bringing the FIG. 1A structure including the uncured adhesive layer 105 into contact with the layer 118 of the substrate plate 116 and holding this contact position with a small force during the adhesive cure sequence specified by the manufacturer. The apperance of the devices 102 and 104 and the substrate plate 116 during this curing is as shown in FIG. 1B of the drawings.

Figure 1B:
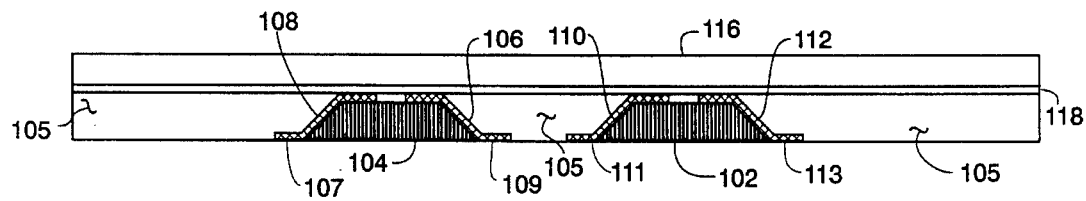
FIG. 1B shows the FIG. 1A devices attached to a second sacrificial substrate member.

The intermediary substrate plate 116 is provided with the above referred-to surface coating which forms the undercut layer shown at 118 in FIG. 1B. This undercut layer is preferably composed of silicon dioxide formed according to the low temperature process of U.S. Pat. No. 4,900,591 which is also incorporated by reference herein. This undercut layer 118 forms the means for later removal of the intermediary substrate plate 116. The undercut layer may actually be fabricated from either silicon dioxide or iron oxide, materials which are typical transparent thin film coatings for photomasks. The undercut layer 118 preferably has a thickness greater than 0.1 micrometers. The intermediary or second sacrificial substrate plate 116 is preferably made of glass, e.g. soda glass, which provides the desired dimensional stability to maintain the frozen geometric precision of the FIG. 1A structure and has the desired optical transparency. The second substrate plate 116 itself preferably has a thickness greater than one millimeter.

To accomplish the FIG. 1B illustrated sacrificial substrate removal, the InP substrate 100 is thinned from a typical thickness of 500 micrometers to as little as one micrometer by polishing with, for example, 5 micrometer alumna grit in water. The remainder of the InP substrate 100 is removed by chemical etching in 4:1 HCl:H$_2$O or 1:1 HCl:water. This etch selectively removes the InP from all areas, including from the metal electrode pads 107, 109, 111 and 113 of the devices 102 and 104.

The substrate plate 116 and the elements 102 and 104 are then aligned visually to a third or tertiary substrate 122, which is the permanent substrate and which contains additional electrical functionality. A contact mask aligner easily performs this task—as readily as it does the alignment of a common shadow mask to a semiconductor substrate. This alignment process is shown in FIG. 1C, where the FIG. 1A elements are shown with their original numbering and where typical additional electrical components e.g. the mesas of two attending transistors 124 and 126, are shown to be received on the permanent substrate 122.

Also shown on the substrate 122 are the smaller landing mesas 123, 125, 127 and 129 which are provided with the complementary conductors or pads 131, 132, 133 and 134 which are to receive and bond with the electrode pads 107, 109, 111 and 113 of the conductors 106 and 110 of the optoelectronic transducer devices 102 and 104. The transistors 124 and 126 may be bias supply or amplifier transistors for the optoelectronic transducer devices 102 and 104 for example. As represented in FIG. 1C the metal conductors 108 and 112 of the optoelectronic transducer devices 104 and 102 are intended for direct electrical connection with the metal pads 131 and 133 of the transistors 126 and 124.

Figure 1C:
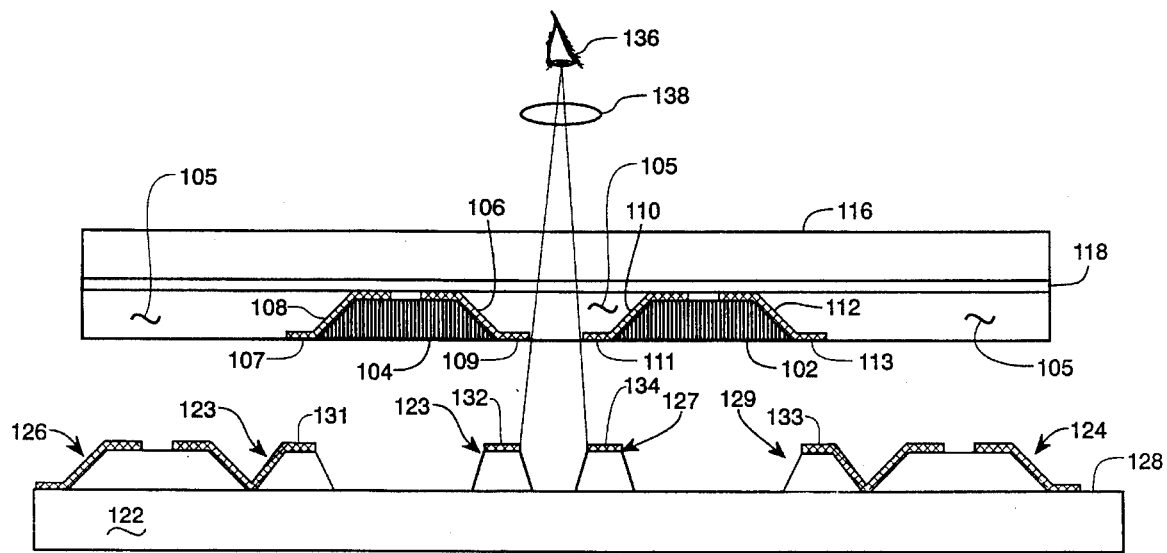
FIG. 1C shows alignment of the FIG. 1B devices with third (and permanent) substrate-received complementing circuit devices.

FIG. 1C also shows in representative form the visual alignment apparatus which may, as indicated above actually, comprise a contact mask aligner of the type known in the integrated circuit art. In FIG. 1C the eye 136 and the lens 138 are used to represent this mask aligner apparatus. The alignment represented in FIG. 1C is of course accomplished for all of the devices on the two substrates 116 and 122, since these devices are presumed to be fabricated in registration.

Figure 1D:
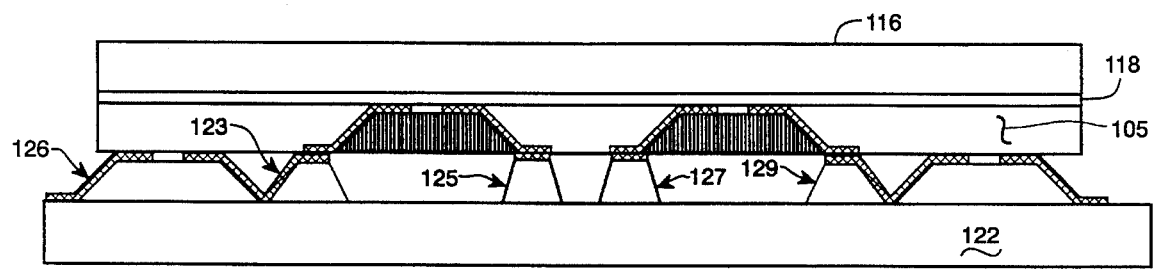
FIG. 1D shows the two substrate-mounted devices after bonding together.

After the FIG. 1C alignment the two substrates 116 and 122 are brought into physical contact, just as a shadow mask is brought into contact with a semiconductor substrate during contact lithography. Several bonding means are available to join the devices of the substrate 116 to the substrate 122. The method preferred is to form bonded metal-metal contacts between the pad 107 of the conductor 108 and the pad 131 of the device 126 and its landing mesa 123. These pads are readily joined with simple annealing. In the case of indium-indium bonds this annealing would take place at about 250 degrees C. An additional approach is to form a bead of adhesive such as epoxy on the rim of the wafer 122, making a seal to the intermediary plate 116 during the metal-metal fusing. The joined devices are shown in FIG. 1D.

Following device joining the intermediary plate second sacrificial substrate 116 is removed through selective undercut etching of the undercut layer 118. This layer, either silicon dioxide or iron oxide is dissolved, for the case of the silicon dioxide layer in a solution of hydrofluoric acid. This etch step does not affect the formed devices 102 and 104 in any manner. This undercut removal is indicated in FIG. 1E by the space at 144 and 146.

Figure 1E:
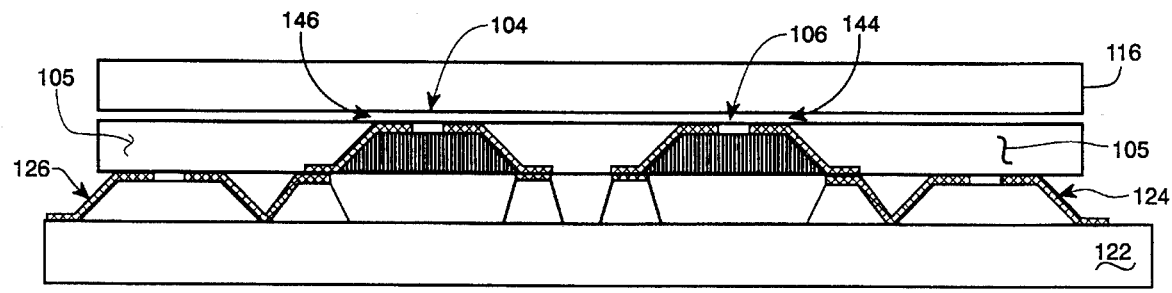
FIG. 1E shows the bonded-together devices after removal of the second sacrificial substrate.
Figure 1F:
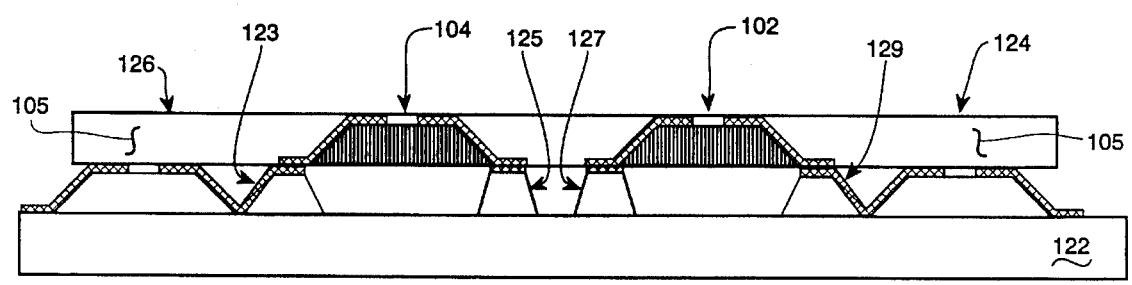
FIG. 1F shows the permanent substrate mounted devices in completed or ready for subsequent processing form.

The final integrated structure is also indicated in FIG. 1E. At this stage the permanent third or tertiary wafer 122 is intact, and circuit fabrication and packaging may continue as normal. Additional interconnect metallizations and passivation may for example be performed on the FIG. 1F wafer as a whole.

The described process has therefore integrated all of the circuits present on multiple wafers (typically there are hundreds of such circuits on each wafer) simultaneously, greatly reducing assembly time as compared with multi-chip modules or hybrid assembly processes.

It is significant to note therefore that through the combined use of substrate removal (in this case removal of two substrates) and see-through alignment of wafers that are to be merged, the present invention enables the one act combining of circuit elements arrayed on two different substrate wafers. Such wafer-scale combining or marriage of circuits has been long sought-after in the electronic art, but has heretofore been impractical outside of a laboratory setting if possible at all.

The disclosed method also eliminates difficulties associated with the growth of non-lattice matched materials such as InP grown on silicon by eliminating the need for such material combinations. Such growth typically results in layers with unacceptable levels of defects. The described method also allows parallel fabrication of differing device structures according to their own demands, which are often in conflict. For example, InP device structures cannot withstand many of the high temperature processes such as oxidation and diffusion which are required for silicon circuit processing. The processing advantage of the present invention also applies to wafer fusion methods which typically bond dissimilar materials before device fabrication.

In yet another advantage of the present invention, processing, which requires lift-off techniques and the use of an AlAs undercut layer grown into the epitaxial layer of a first structure are avoided. Such an AlAs layer is ultimately removed through selective wet etching. However, AlAs is not an appropriate material for growth on InP structures because of the different lattice constants involved. Attempts to grow this undercut layer on InP materials therefore result in large defect densities, which the herein described method avoids.

The herein described method also increases circuit operating bandwidth over that of a multi-chip assembly arrangement by reducing the distances between active devices. This distance reduction results at least in part from the enhanced alignment accuracy available at the wafer level as opposed to alignments obtained with discrete devices. This distance reduction directly reduces parasitic capacitance, inductance, and resistance and hence directly increases circuit bandwidth.

While the apparatus and method herein described constitute a preferred embodiment of the invention, it is understood that the invention is not limited to this precise form of apparatus or method and that changes may be made therein without departing from the scope of the invention which is defined in the appended claims.

What is claimed is:

1. The full wafer method of fabricating first semiconductor material comprised and second semiconductor material comprised photo transducer inclusive electronic circuit assemblies comprising the steps of:

forming on an exposed surface of a first semiconductor material first wafer substrate member a buffer and stop etch layer of a first metal inclusive alloy;

growing on said buffer and stop etch layer an optical energy absorbing layer of second semiconductor material composition;

depositing on said second semiconductor material layer a current blocking barrier layer of a second metal inclusive alloy;

removing lateral area portions of said formed, grown and deposited layers to define in the remainder thereof upstanding epitaxial layered mesas of said second semiconductor material included composition;

disposing layers of ohmic electrical contact first metal alloy on selected contact areas of said upstanding epitaxial layered mesas;

fabricating electrical gate non-conductive electrodes of second metal alloy composition on selected areas of said upstanding epitaxial layered mesas;

attaching exposed mesa surface portions of said wafer of photodetector devices to a surface coated optically transparent intermediary second substrate member;

removing said first semiconductor material first wafer from said second intermediary substrate member attached mesas to expose said optical energy layer backside surface portion of each said mesa;

visually aligning said second intermediary substrate member fixed wafer array of mesas and said disposed and fabricated areas of first and second metal alloy attendant thereto with registered and additional metal attended electrical circuit areas of a third substrate member second semiconductor wafer;

contacting and bonding together said second substrate member metal alloy and said third substrate member additional metal to form an array of two-wafer received electrical circuit assemblies having an exposed backside photodetector input port each;

removing said intermediary second substrate member from said bonded together electrical circuit assemblies; and segregating said array of two substrate wafer received electrical circuit assemblies into individual circuit die of said second semiconductor and said second substrate member respective dispositions and exposed backside photodetector input port each.

2. The method of claim 1 wherein:

said wafer of first semiconductor material is comprised of indium phosphide;

said buffer and stop etch layer of metal inclusive alloy is comprised of indium aluminum arsenide;

said optical energy absorbing layer of second semiconductor material is comprised of indium gallium arsenide;

said current blocking barrier layer is comprised of indium aluminum arsenide;

said ohmic electrical contact first metal alloy is comprised of gold germanium nickel; and said electrical gate non conductive electrode second metal alloy is comprised of titanium gold.

3. The method of claim 2 wherein said growing of an optical energy absorbing layer includes a molecular beam epitaxy growth process.

4. The method of claim 2 wherein said deleting step includes a thinning by polishing first step and a removing by etching second step.

5. The method of claim 1 further including the step of covering said upstanding mesas and said metal alloy contact and electrode members thereon with a passivation coating of silicon dioxide.

6. The method of claim 2 wherein said removing step includes removal of said deposited grown and formed layers of indium aluminum arsenide, indium gallium arsenide, and indium aluminum arsenide down to said indium phosphide wafer surface in regions intermediate said ohmic electrical contact metal.

7. The method of claim 1 wherein disconnecting step includes etching away of an oxide undercut layer.

8. The method of claim 1 wherein said visually aligning step includes viewing said third substrate member registered additional metal attended electrical circuit areas through said first semiconductor material first wafer removed mesa structure in a contact mask aligner apparatus.

9. The method of claim 1 wherein said attaching step includes attachment via an electrically insulating thermally conductive transparent epoxy adhesive to said second substrate member.

10. The method of claim 1 wherein said contacting and bonding step includes a thermal anneal bonding step.

11. The method of claim 1 wherein said disconnecting step includes selective undercut etching of a surface coating layer portion of said intermediary second substrate member.

12. The method of fabricating dissimilar wafer received photo field effect transistor electrical circuit assemblies comprising the steps of:

fabricating an array of epitaxial layered first semiconductor material comprised, mesa member configured, photo field effect transistor elements that are received via metal conductor bearing mesa plateau surfaces thereof on a secondary substrate wafer member;

visually aligning said mesa members and said mesa connected metal conductors with congruently complementary metal conductors of a tertiary permanent substrate wafer member;

contacting and bonding together said metal conductors of said secondary and tertiary wafer substrate members to form an array of two-wafer received phototransistor assemblies;

removing said secondary substrate wafer member from said array of phototransistor assemblies;

segregating said array of phototransistor assemblies into sub assemblies of at least one phototransistors each.

13. The method of claim 12 further including the step of fabricating on said tertiary substrate member prior to said visually aligning step an array of photo field effect transistor complementing electrical signal operated electrical circuits.

14. The method of claim 13 wherein said secondary and tertiary substrate wafer members are comprised of different and process-incompatible semiconductor materials.

15. The method of claim 12 further including the step of forming said mesa configured first semiconductor material comprised epitaxial layers in epitaxial relationship with a different semiconductor material primary substrate member.

16. The method of claim 15 wherein said mesa configured epitaxial layers are comprised of arsenic inclusive semiconductor material and said primary substrate member is comprised of phosphorous inclusive semiconductor material.

\* \* \* \* \*